(12) United States Patent
Reiter et al.

(10) Patent No.: US 12,493,059 B2
(45) Date of Patent: Dec. 9, 2025

(54) SEMICONDUCTOR MODULE, METHOD FOR FABRICATING A SEMICONDUCTOR MODULE, AND SYSTEM

(71) Applicant: Infineon Technologies AG, Neubiberg (DE)

(72) Inventors: Tomas Reiter, Ottobrunn (DE); Dietmar Spitzer, Völkermarkt (AT); Christoph Koch, Salzkotten (DE); Patrik Holt Jones, Soest (DE)

(73) Assignee: Infineon Technologies AG, Neubiberg (DE)

( * ) Notice: Subject to any disclaimer, the term of this patent is extended or adjusted under 35 U.S.C. 154(b) by 587 days.

(21) Appl. No.: 17/959,458

(22) Filed: Oct. 4, 2022

(65) Prior Publication Data

US 2023/0123783 A1 Apr. 20, 2023

(30) Foreign Application Priority Data

Oct. 15, 2021 (DE) .......................... 102021126850.8

(51) Int. Cl.
*G01R 15/20* (2006.01)
*H01L 21/48* (2006.01)
(Continued)

(52) U.S. Cl.
CPC ........ *G01R 15/207* (2013.01); *H01L 21/4839* (2013.01); *H01L 21/565* (2013.01);
(Continued)

(58) Field of Classification Search
CPC ........ G05B 2219/41292; H02H 7/0838; H02P 7/04; H01L 2924/14; H01L 2924/141;
(Continued)

(56) References Cited

U.S. PATENT DOCUMENTS

| 2012/0112365 A1* | 5/2012 | Ausserlechner | ........ H01L 23/16 |
| | | | 438/126 |
| 2012/0146165 A1* | 6/2012 | Ausserlechner | ....... H10N 52/01 |
| | | | 257/E29.323 |

(Continued)

FOREIGN PATENT DOCUMENTS

DE 102015108253 A1 11/2015
DE 112017005760 T5 8/2019

*Primary Examiner* — Dale E Page
*Assistant Examiner* — Douglas Yap
(74) *Attorney, Agent, or Firm* — Murphy, Bilak & Homiller, PLLC (57) ABSTRACT

A semiconductor module includes a semiconductor die, an encapsulation encapsulating the die, and first and second power contacts electrically coupled to the die. The power contacts each include an external part exposed from the encapsulation and an overlapping part. The power contacts are configured to carry respective first and second currents. A current flow of the first current in the external part of the first power contact points into or out of the semiconductor module. A current flow of the second current in the external part of the second power contact points in the opposite direction of the first current flow. The overlapping parts overlap such that the current flows point in the same direction in the overlapping parts. The overlapping parts include overlapping slots configured to accept a current sensor element for measuring a combined current in the overlapping parts.

14 Claims, 4 Drawing Sheets

(51) Int. Cl.
 *H01L 21/56*    (2006.01)
 *H01L 23/29*    (2006.01)
 *H01L 23/31*    (2006.01)
 *H01L 23/367*    (2006.01)
 *H01L 23/373*    (2006.01)
 *H01L 23/498*    (2006.01)
 *H02M 1/00*    (2007.01)
 *H02P 7/03*    (2016.01)
 *H10N 59/00*    (2023.01)

(52) U.S. Cl.
 CPC ........ *H01L 23/293* (2013.01); *H01L 23/3121* (2013.01); *H01L 23/367* (2013.01); *H01L 23/3736* (2013.01); *H01L 23/49844* (2013.01); *H01L 23/49861* (2013.01); *H02M 1/0009* (2021.05); *H10N 59/00* (2023.02); *G01R 15/202* (2013.01); *G05B 2219/41292* (2013.01); *H02P 7/04* (2016.02)

(58) Field of Classification Search
 CPC ... H01L 2924/14252; H01L 2924/1426; H01L 2924/1427; H01L 2924/1425; H01L 2924/13055; H01L 25/065–0657; H01L 25/16–167; G01R 33/072; G01R 33/077; G01R 15/20–207; G01R 15/202; H10N 59/00

See application file for complete search history.

(56) References Cited

U.S. PATENT DOCUMENTS

2015/0355241 A1   12/2015   Kawanami
2022/0069746 A1*   3/2022   Chu .................... H02P 6/10

* cited by examiner

SEMICONDUCTOR MODULE, METHOD FOR FABRICATING A SEMICONDUCTOR MODULE, AND SYSTEM

TECHNICAL FIELD

This disclosure relates in general to a semiconductor module, to a method for fabricating a semiconductor module, as well as to a system comprising a semiconductor module and a sensor module.

BACKGROUND

A semiconductor module may be configured to provide a specific output power, for example for electric motor applications. It may be necessary to tightly control the output power and for this reason a current sensor may be arranged on the semiconductor module. However, current sensors, in particular current sensors with a core or flux concentrator occupy some space which in turn hinders miniaturization efforts. Furthermore, current sensors with a core may suffer from core saturation, insufficient measurement accuracy and other problems. Improved semiconductor modules, improved methods for fabricating semiconductor modules and improved systems comprising a semiconductor module and a sensor module may solve these and other problems.

The problem on which the invention is based is solved by the features of the independent claims. Further advantageous examples are described in the dependent claims.

SUMMARY

Various aspects pertain to a semiconductor module comprising at least one semiconductor die, an encapsulation encapsulating the at least one semiconductor die, a first and a second power contact electrically coupled to the at least one semiconductor die, wherein the first and second power contacts each comprise an external part exposed from the encapsulation and an overlapping part, wherein the first power contact is configured to carry a first current and the second power contact is configured to carry a second current, wherein a current flow of the first current in the external part of the first power contact points into or out of the semiconductor module and a current flow of the second current in the external part of the second power contact points in the opposite direction of the first current flow, wherein the overlapping parts overlap such that the current flows point in the same direction in the overlapping parts, and wherein the overlapping parts comprise overlapping slots configured to accept a current sensor element for measuring a combined current in the overlapping parts.

Various aspects pertain to a method for fabricating a semiconductor module, the method comprising: providing at least one semiconductor die, encapsulating the at least one semiconductor die with an encapsulation, electrically coupling a first and a second power contact to the at least one semiconductor die, wherein the first and second power contacts each comprise an external part exposed from the encapsulation and an overlapping part, wherein the first power contact is configured to carry a first current and the second power contact is configured to carry a second current, wherein a current flow of the first current in the external part of the first power contact points into or out of the semiconductor module and a current flow of the second current in the external part of the second power contact points in the opposite direction of the first current flow, wherein the overlapping parts overlap such that the current flows point in the same direction in the overlapping parts, and wherein the overlapping parts comprise overlapping slots configured to accept a current sensor element for measuring a combined current in the overlapping parts.

Various aspects pertain to a system comprising a semiconductor module and a sensor module comprising a current sensing element.

BRIEF DESCRIPTION OF THE DRAWINGS

The accompanying drawings illustrate examples and together with the description serve to explain principles of the disclosure. Other examples and many of the intended advantages of the disclosure will be readily appreciated in view of the following detailed description. The elements of the drawings are not necessarily to scale relative to each other. Identical reference numerals designate corresponding similar parts.

DETAILED DESCRIPTION

In the following detailed description, directional terminology, such as "top", "bottom", "left", "right", "upper", "lower", etc. is used with reference to the orientation of the Figure(s) being described. Because components of the disclosure can be positioned in a number of different orientations, the directional terminology is used for purposes of illustration only. It is to be understood that other examples may be utilized and structural or logical changes may be made.

In addition, while a particular feature or aspect of an example may be disclosed with respect to only one of several implementations, such feature or aspect may be combined with one or more other features or aspects of the other implementations as may be desired and advantageous for any given or particular application, unless specifically noted otherwise or unless technically restricted. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives thereof may be used. It should be understood that these terms may be used to indicate that two elements cooperate or interact with each other regardless whether they are in direct physical or electrical contact, or they are not in direct contact with each other; intervening elements or layers may be provided between the "bonded", "attached", or "connected" elements. However, it is also possible that the "bonded", "attached", or "connected" elements are in direct contact with each other. Also, the term "exemplary" is merely meant as an example, rather than the best or optimal.

The examples of a semiconductor module described below may use various types of semiconductor dies or circuits incorporated in the semiconductor dies, among them AC/DC or DC/DC converter circuits, power MOS transistors, power Schottky diodes, JFETs (Junction Gate Field Effect Transistors), power bipolar transistors, logic integrated circuits, analogue integrated circuits, power integrated circuits, etc.

An efficient semiconductor module and an efficient method for fabricating a semiconductor module may for example reduce material consumption, ohmic losses, chemical waste, etc. and may thus enable energy and/or resource savings. Improved semiconductor modules and improved methods for fabricating a semiconductor module, as specified in this description, may thus at least indirectly contribute to green technology solutions, i.e. climate-friendly solutions providing a mitigation of energy and/or resource use.

Figure 1:
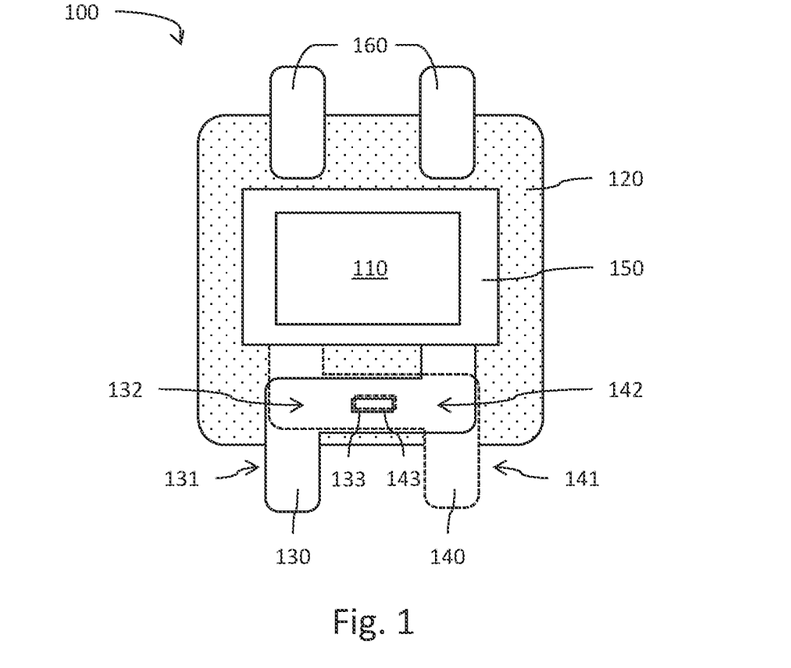
FIG. 1 shows a top view of a semiconductor module, wherein a first and a second power contact of the semiconductor module comprise overlapping parts.

FIG. 1 shows a semiconductor module 100 which comprises at least one semiconductor die 110, an encapsulation 120, a first power contact 130 and a second power contact 140 (the encapsulation 120 is transparent in FIG. 1 in order to show the interior parts of the semiconductor module 100).

The semiconductor module 100 may for example comprise an H-bridge circuit, wherein the first and second power contacts 130, 140 are external contacts of the H-bridge circuit. The semiconductor module 100 may for example comprise an exciter circuit for a rotor of an electric motor or generator, or the semiconductor module 100 may e.g. comprise a DC-DC converter circuit.

The semiconductor module 100 may for example be configured to operate with an electrical current of 100 A or less, or 80 A or less, or 50 A or less. The first and second power contacts 130, 140 may be configured to carry this current. The first and second power contacts 130, 140 may be configured as power outlets of a circuit of the semiconductor module 100.

The first and second power contacts 130, 140 are electrically coupled to the at least one semiconductor die 110. The first power contact 130 is configured to carry a first current and the second power contact 140 is configured to carry a second current. The first and second currents may for example have the same amplitude. The first and second currents may for example be alternating currents, wherein the second current has an inverted polarity compared to the first alternating current. According to another example, the first and second currents are direct currents, wherein the first direct current points into or out of the semiconductor module 100 and the second direct current points in the opposite direction compared to the first direct current.

The encapsulation 120 encapsulates the at least one semiconductor die 110. The encapsulation 120 may partially encapsulate the first and second power contacts 130, 140. The first and second power contacts 130, 140 each comprise an external part 131, 141 exposed from the encapsulation 120 and an overlapping part 132, 142. The overlapping parts 132, 142 overlap such that during operation of the semiconductor module 100 the current flows of the first and second currents point in the same direction in the overlapping parts 132, 142. This may comprise that at a given point in time, the current flow of the first current in the external part 131 of the first power contact 130 points into the semiconductor module 100 and the current flow of the second current in the external part 141 of the second power contact 140 points out of the semiconductor module 100, or vice versa.

Furthermore, the overlapping parts 132, 142 comprise overlapping slots 133, 143 configured to accept a current sensor element for measuring a combined current in the overlapping parts 132, 142.

The first and second power contacts 130, 140, in particular the overlapping parts 132, 142, may be arranged in two different planes. It should be noted that in FIG. 1 the second power contact 140 is drawn with dashed lines and the overlapping part 142 is drawn slightly shifted with respect to the overlapping part 132 of the first power contact 130 in order to show the arrangement in the two different planes. However, in truth the overlapping parts 132, 142 may be exactly overlapping. According to another example, the overlapping parts 132, 142 may be shifted with respect to each other, such that an overlap is reduced. However, in both cases the slots 133, 143 may overlap such that a current sensor element may be inserted into both slots 133, 143.

The semiconductor die 110 may for example be a power semiconductor die. The semiconductor module 100 may comprise several semiconductor dies coupled together to form an electrical circuit like the examples of electrical circuits mentioned further above.

According to an example, the semiconductor module 100 comprises a carrier 150, wherein the at least one semiconductor die 110 is arranged on and electrically coupled to the carrier 150. The carrier 150 may for example be of the type direct copper bond (DCB), direct aluminum bond (DAB), active metal braze (AMB), printed circuit board (PCB), or leadframe. According to an example, the first power contact 130 and/or the second power contact 140 may be electrically and/or mechanically coupled to the carrier 150. The carrier 150 may be completely or partially encapsulated by the encapsulation 120.

The encapsulation 120 may comprise or consist of any suitable dielectric material. The encapsulation 120 may for example comprise a plastic frame and/or a molded body. The encapsulation 120 may comprise a plurality of holes configured for accepting contact pins. The contact pins may e.g. be arranged perpendicular to the first and second power contacts 130, 140. The semiconductor module 100 may e.g. be configured for arranging an application board over the encapsulation 120 and electrically coupling the application board to the semiconductor module 100 using the contact pins.

According to an example, the overlapping parts 132, 142 of the first and second power contacts 130, 140 are encapsulated by the encapsulation 120.

The first and second power contacts 130, 140 may for example comprise or consist of a metal or metal alloy. The first and second power contacts 130, 140 may e.g. comprise or consist of Al, Fe, or Cu. The first and second power contacts 130, 140 may e.g. be leadframe parts.

The exposed parts 131, 141 of the first and second power contacts 130, 140 may be arranged in a same first plane. The first and second power contacts 130, 140 may comprise interior ends which are arranged in a same second plane. The first and second planes may be identical. The first power contact 130 and/or the second power contact 140 may comprise a bent shape such that the overlapping part(s) 132, 142 are arranged outside of the first and/or second plane. Both overlapping parts 132, 142 may be arranged outside of the first and/or second plane, for example the overlapping part 132 may be arranged above the first and/or second plane and the overlapping part 142 may be arranged below the first and/or second plane. According to another example, only one of the overlapping parts 132, 142 is arranged outside of the first and/or second plane.

The slots 133, 143 in the overlapping parts 132, 142 may have any suitable shape and any suitable dimensions. The slots 133, 143 may for example have a rectangular shape, an elliptical shape, a round shape, a quadratic shape, etc. The slots 133, 143 may for example have a rectangular shape with a length of 20 mm or less, or 15 mm or less, or 10 mm or less, or 6 mm or less and a width of 10 mm or less, or 8 mm or less, or 6 mm or less, or 4 mm or less.

The slots 133, 143 may be arranged at any suitable position in the overlapping parts 132, 142. The slots 133, 143 may for example be arranged along a central axis of the overlapping parts 132, 142. According to an example, the slots 133, 143 have a rectangular or elliptical shape, wherein the longer side is parallel to the central axis of the overlapping parts 132, 142. According to another example, the longer side is arranged perpendicular to the central axis.

According to an example, the semiconductor module 100 comprises further contacts 160. The further contacts 160 may e.g. be power contacts of the semiconductor module 100. The further contacts 160 may e.g. be power inlets of the semiconductor module 100. The further contacts 160 may e.g. be configured to carry a direct current or an alternating current. The further contacts 160 may e.g. comprise or consist of the same material or material composition as the first and second power contacts 130, 140. According to an example, the further contacts 160 are leadframe parts.

Figure 2A:
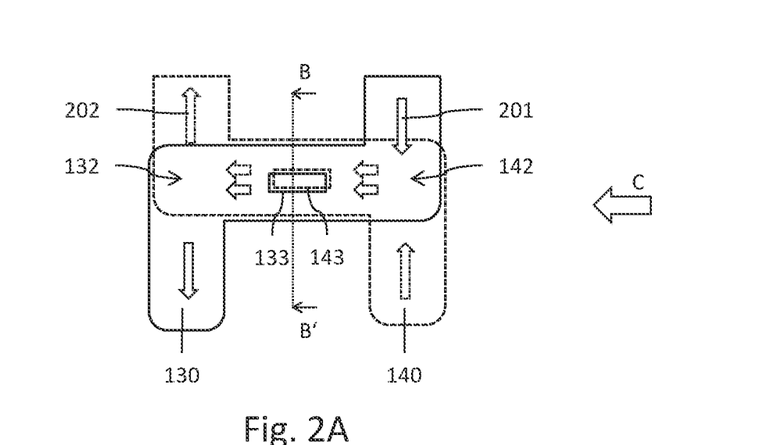
FIGS. 2A to 2C show detail views of the first and second power contacts of FIG. 1.

FIG. 2A shows a detail view of the first and second power contacts 130, 140. FIG. 2A in particular shows the current flow 201 of the first current through the first power contact 130 and the current flow 202 of the second current through the second power contact 140 during operation of the semiconductor module 100.

As shown in FIG. 2A, the first and second currents point in opposite directions in the internal and external ends of the first and second power contacts 130, 140. However, the overlapping parts 132, 142 are arranged such that the current flows 201, 202 in the overlapping parts 132, 142 point in the same direction (in FIG. 2A, to the left). A current sensor arranged in the slots 133, 143 may therefore detect the sum of the first and second currents. In this way, the signal to noise ratio may be improved and the measurement inaccuracy may be reduced.

Figure 2B:
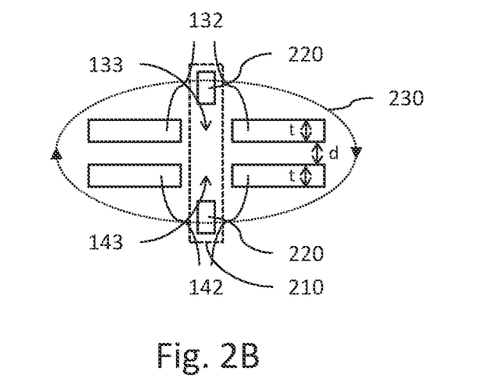

FIG. 2B shows a sectional view of the overlapping parts 132, 142 along the line B-B' in FIG. 2A. Also indicated in FIG. 2B are a current sensor element 210 which may be arranged in the slots 133, 143, as well as a magnetic flux 230 generated by a combination of the first and second currents in the overlapping parts 132, 142 during operation of the semiconductor module 100.

The current sensor element 210 may for example comprise magnetic field sensitive parts 220. The current sensor element 210 may for example be a Hall sensor element. The current sensor element 210 may be configured to operate without a magnetic core or flux concentrator because the current sensor element 210 is arranged in the slots 133, 143. Such a core or flux concentrator would increase the required size of a current sensor. A coreless current sensor element 210 may also have the advantage of faster overcurrent detection and/or higher total accuracy. A coreless current sensor element 210 may also avoid the disadvantage of core saturation and/or core magnetization.

A first one of the magnetic field sensitive parts 220 may for example be arranged above the overlapping part 132 of the first power contact 130 and a second one of the magnetic field sensitive parts 220 may for example be arranged below the overlapping part 142 of the second power contact 140. Since the current flows of the first and second currents in the overlapping parts 132, 142 point in the same direction, the magnetic flux at the position of the magnetic field sensitive parts 220 is increased. This improves the measurement accuracy of the current sensor element 210.

According to an example, the magnetic field sensitive elements 220 are arranged at a distance to each other of 4 mm or less, or 3 mm or less, or 2.5 mm or less, or 2.26 mm or less.

The first and second power contacts 130, 140, in particular the overlapping parts 132, 142, may for example have a thickness t of 1.5 mm or less, or 1 mm or less, or 0.5 mm or less. The overlapping parts 132, 142 may for example be arranged at a distance d to each other of 2 mm or less, or 1.5 mm or less, or 1 mm or less, or 0.8 mm or less.

A space between the overlapping parts 132, 142 may be filled with dielectric material in order to electrically insulate the overlapping parts 132, 142 from each other. According to an example, the space between the overlapping parts 132, 142 is filled by the encapsulation 120.

Figure 2C:
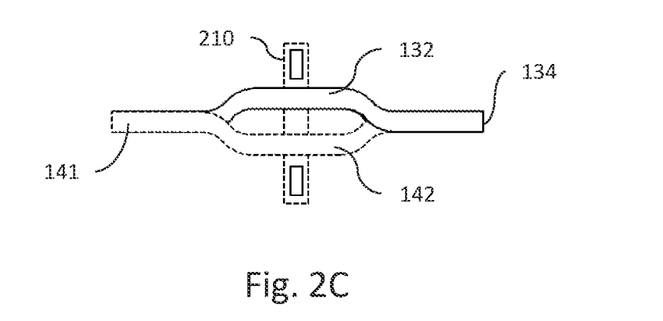

FIG. 2C shows a side view of the first and second power contacts 130, 140 along the arrow C in FIG. 2A. The potential position of the current sensor element 210 with respect to the first and second power contacts 130, 140 is also indicated in FIG. 2C.

An interior end 134 of the first power contact 130 is shown in the forefront of FIG. 2C. Then, the overlapping part 132 of the first power contact 130 extends into the drawing layer such that the exposed part 131 of the first power contact 130 is obscured by the exposed part 141 of the second power contact 140 in FIG. 2C.

In the example shown in FIG. 2C, the first power contact 130 is bent twice such that the overlapping part 132 is arranged above a plane comprising the interior end 134 and the exposed part 131. The second power contact 140 is also bent twice such that the overlapping part 142 is arranged above a plane comprising an interior end and the exposed part 141 of the second power contact 140. Furthermore, the exposed parts 131, 141 and the interior ends of both the first and second power contacts 130, 140 are arranged in the same plane in the example of FIG. 2C. As mentioned further above, other relative arrangements of the exposed parts 131, 141, the overlapping parts 132, 142 and/or the interior ends are possible, as long as the overlapping parts 132, 142 actually overlap. For example, only the first power contact 130 might be bent such that the overlapping part 132 is arranged outside of the plane comprising the exposed parts 131, 141 and the interior ends, whereas the overlapping part 142 of the second power contact is arranged within this plane.

Figure 3:
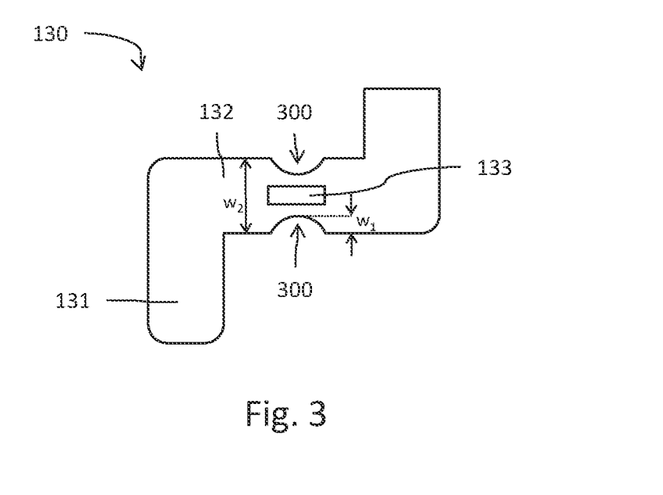
FIG. 3 shows a detail view of a particular example of the first power contact of FIG. 1, wherein the overlapping part comprises narrowings.

FIG. 3 shows a specific example of the first power contact 130, wherein the overlapping part 132 comprises at least one narrowing 300. The overlapping part 132 may in particular comprise two narrowings 300. The narrowing(s) 300 may be arranged laterally next to the slot 133, for example at opposite sides of the slot 133.

The narrowing(s) 300 may constrict the overlapping part 132 at the slot 133, thereby increasing the current density at the slot 133 during operation of the semiconductor module 100. This in turn may improve the signal detected by the current sensor element 210 in the slot 133.

The narrowing(s) 300 may have any suitable shape, e.g. a rounded shape as shown in the example of FIG. 3. The narrowing(s) may for example have a width $w_1$ of 1 mm or more, or 2 mm or more, or 2.5 mm or more, or 3 mm or more. The overlapping part 132 may for example have a width $w_2$ of 25 mm or less, or 20 mm or less, or 15 mm or less, or 14 mm or less, or 12 mm or less, or 10 mm or less.

The overlapping part 132 and the external part 131 of the first second power contact 130 may for example be arranged at an angle of 60° or more relative to each other. As shown in the example of FIG. 3, the external part 131 and the overlapping part 132 may in particular be arranged at an angle of 90° relative to each other.

According to an example, the second power contact 140 may comprise the narrowing(s) 300 and/or have the shape and dimensions as described with respect to the first power contact 130.

Figure 4A:
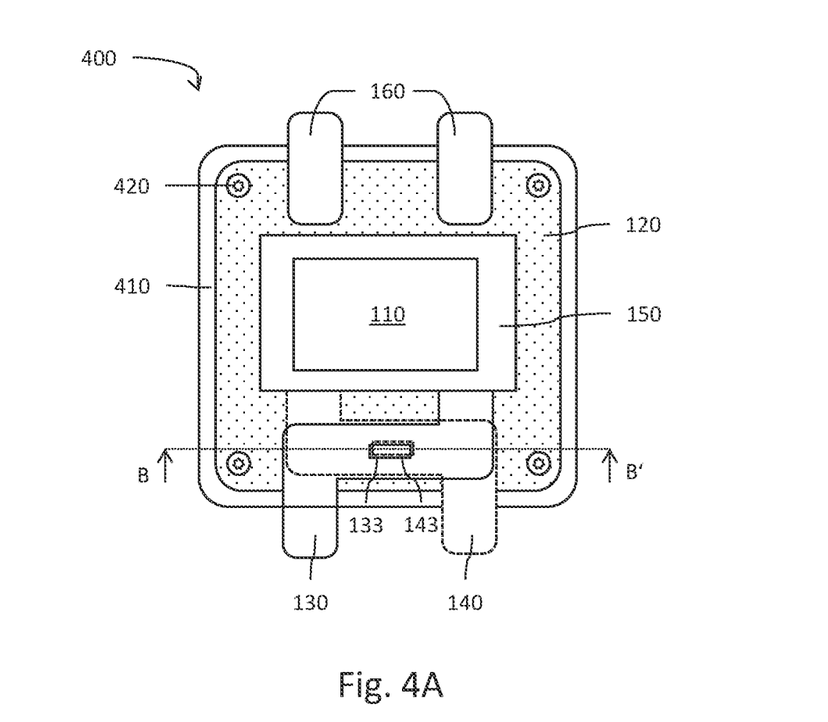
FIGS. 4A and 4B show a further semiconductor module with overlapping first and second power contacts, wherein the semiconductor module also comprises a baseplate.
Figure 4B:
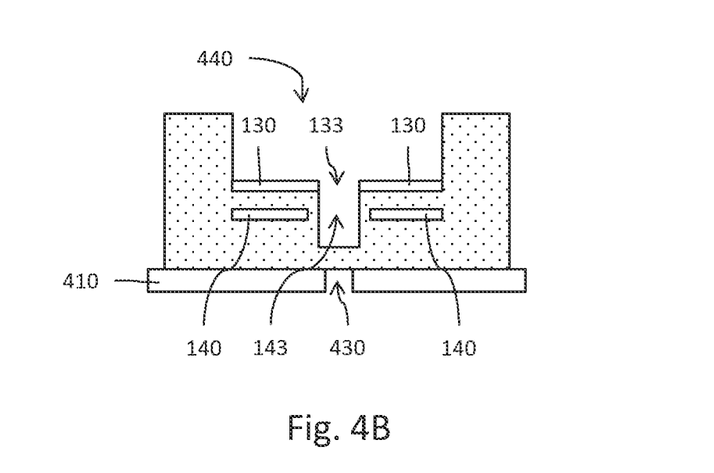

FIGS. 4A and 4B show a further semiconductor module 400 which may be similar or identical to the semiconductor module 100. The semiconductor module 400 may comprise all components described with respect to the semiconductor module 100 and it may additionally comprise a baseplate 410.

The baseplate 410 may comprise or consist of a metal or metal alloy. The baseplate 410 may for example comprise or consist of Al, Fe, or Cu. The baseplate 410 may be configured as a heatspreader for spreading heat generated by the at least one semiconductor die 110 during operation. The semiconductor module 400 may comprise one or more carriers 150, wherein the one or more semiconductor dies 110 are arranged on the carrier(s) 150 and wherein the carrier(s) 150 are arranged on the baseplate 410.

The baseplate 410 may be exposed from the encapsulation 120. According to an example, fastening means 420 like screws or rivets may be used to mechanically couple the encapsulation 120 to the baseplate 410.

FIG. 4B shows a sectional view of the semiconductor module 400 along the line B-B' in FIG. 4A. As shown in FIG. 4B, the baseplate 410 may comprise a through hole 430. The through hole 430 may in particular be arranged directly below the slots 133, 143 in the first and second power contacts 130, 140.

During operation of the semiconductor module 400, the magnetic field generated by the first and second currents running through the first and second power contacts 130, 140 may cause eddy currents in the baseplate 410 which in turn may affect the measurement of the current sensor element 210. However, by properly aligning the through hole 430 with the slots 133, 143 and/or by properly dimensioning the through hole 430, a negative impact of the eddy currents on the current measurement may be avoided. In this case, the baseplate 410 may act as kind of flux concentrator for the current sensor element 210.

As also shown in FIG. 4B, the encapsulation 120 may comprise an opening 440 configured for accepting the current sensor element 210. The opening 440 may in particular be configured for accepting a sensor module, wherein the sensor module comprises the current sensor element 210 and an encapsulation at least partially encapsulating the current sensor element 210. The encapsulation 120 may comprise fastening means for fastening the sensor module to the semiconductor module 400.

Figure 5:
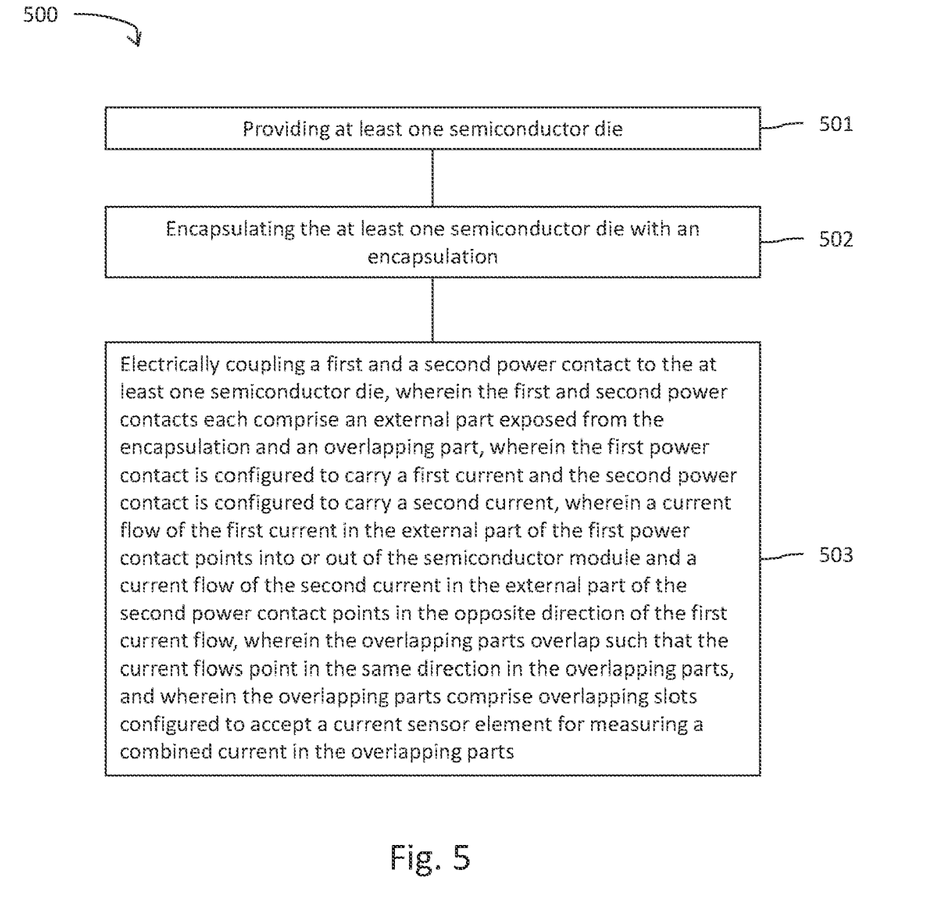
FIG. 5 is a flowchart of an exemplary method for fabricating semiconductor modules.

FIG. 5 is a flow chart of a method 500 for fabricating a semiconductor module. The method 500 may for example be used to fabricate the semiconductor module 100 or 400.

The method 500 comprises at 501 a process of providing at least one semiconductor die, at 502 a process of encapsulating the at least one semiconductor die with an encapsulation, and at 503 a process of electrically coupling a first and a second power contact to the at least one semiconductor die, wherein the first and second power contacts each comprise an external part exposed from the encapsulation and an overlapping part, wherein the first power contact is configured to carry a first current and the second power contact is configured to carry a second current, wherein a current flow of the first current in the external part of the first power contact points into or out of the semiconductor module and a current flow of the second current in the external part of the second power contact points in the opposite direction of the first current flow, wherein the overlapping parts overlap such that the current flows point in the same direction in the overlapping parts, and wherein the overlapping parts comprise overlapping slots configured to accept a current sensor element for measuring a combined current in the overlapping parts.

Figure 6:
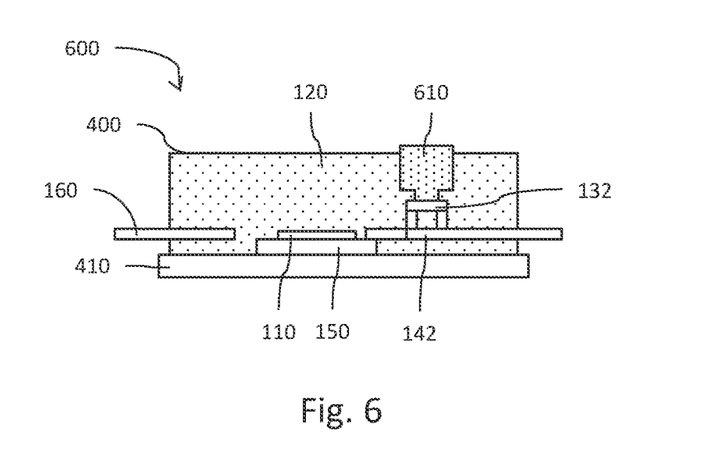
FIG. 6 is a sectional view of a system comprising a semiconductor module and a sensor module.

FIG. 6 shows a system 600 comprising the semiconductor module 400 and a sensor module 610 coupled to the semiconductor module 400. The sensor module 610 comprises the current sensor element 210 (compare FIG. 2B). The sensor module 610 may for example be arranged in the opening 440 of the encapsulation 120 (compare FIG. 4B). The semiconductor module 400 and the sensor module 610 may be configured to be coupled to the same application board.

According to an example, the system 600 comprises the semiconductor module 100 instead of the semiconductor module 400.

In the following, the semiconductor module, the method for fabricating a semiconductor module and the system are further explained using specific examples.

Example 1 is a semiconductor module comprising at least one semiconductor die, an encapsulation encapsulating the at least one semiconductor die, a first and a second power contact electrically coupled to the at least one semiconductor die, wherein the first and second power contacts each comprise an external part exposed from the encapsulation and an overlapping part, wherein the first power contact is configured to carry a first current and the second power contact is configured to carry a second current, wherein a current flow of the first current in the external part of the first power contact points into or out of the semiconductor module and a current flow of the second current in the external part of the second power contact points in the opposite direction of the first current flow, wherein the overlapping parts overlap such that the current flows point in the same direction in the overlapping parts, and wherein the overlapping parts comprise overlapping slots configured to accept a current sensor element for measuring a combined current in the overlapping parts.

Example 2 is the semiconductor module of example 1, wherein one part of the overlapping parts is fully encapsulated by the encapsulation and the second part is partially encapsulated by the encapsulation. A full encapsulation of one part provides an electrical insulation by solid material, avoiding the need to take into account clearance/creepage distances.

Example 3 is the semiconductor module of example 1 or 2, wherein a minimum distance between the overlapping parts is 1 mm or less.

Example 4 is the semiconductor module of one of the preceding examples, wherein the overlapping parts further comprise narrowings on at least one side of the slots, the narrowings being configured to increase a current density in the overlapping parts between the narrowings and the slots.

Example 5 is the semiconductor module of one of the preceding examples, wherein the overlapping part and the external part of each of the first and second power contacts are at an angle of 60° or more, in particular at an angle of 90°, to each other.

Example 6 is the semiconductor module of one of the preceding examples, further comprising: a baseplate comprising or consisting of a metal or metal alloy, the baseplate comprising a through hole arranged directly below the slots.

Example 7 is the semiconductor module of one of the preceding examples, wherein the first and second power contacts are leadframe parts with a thickness of 1.0 mm or less, in particular a thickness of 0.5 mm or less.

Example 8 is the semiconductor module of one of the preceding examples, wherein the first and second currents are 100 A or less, in particular 50 A or less.

Example 9 is the semiconductor module of one of the preceding examples, wherein the at least one semiconductor die and the first and second power contacts are part of an H-bridge circuit.

Example 10 is a method for fabricating a semiconductor module, the method comprising: providing at least one semiconductor die, encapsulating the at least one semiconductor die with an encapsulation, electrically coupling a first and a second power contact to the at least one semiconductor die, wherein the first and second power contacts each comprise an external part exposed from the encapsulation and an overlapping part, wherein the first power contact is configured to carry a first current and the second power contact is configured to carry a second current, wherein a current flow of the first current in the external part of the first power contact points into or out of the semiconductor module and a current flow of the second current in the external part of the second power contact points in the opposite direction of the first current flow, wherein the overlapping parts overlap such that the current flows point in the same direction in the overlapping parts, and wherein the overlapping parts comprise overlapping slots configured to accept a current sensor element for measuring a combined current in the overlapping parts.

Example 11 is the method of example 10, wherein encapsulating the semiconductor die comprises providing a plastic frame, the plastic frame comprising an opening for accepting the current sensor element.

Example 12 is a system, comprising: the semiconductor module of one of examples 1 to 9, and a sensor module comprising the current sensing element.

Example 13 is the system of example 12, wherein the current sensing element comprises a Hall sensor die.

Example 14 is the system of example 12 or 13, wherein the current sensing element comprises a first and a second magnetic field sensitive part, wherein the first magnetic field sensitive part is arranged above the overlapping part of the first power contact and the second magnetic field sensitive part is arranged below the overlapping part of the second power contact.

Example 15 is the system of example 14, wherein a distance between the magnetic field sensitive parts is 2.5 mm or less.

Example 16 is an apparatus comprising means for performing the method of one of examples 10 or 11.

While the disclosure has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure.

What is claimed is:

1. A semiconductor module, comprising:
a semiconductor die;
an encapsulation encapsulating the semiconductor die; and
a first and a second power contact electrically coupled to the semiconductor die, wherein the first and second power contacts each comprise an external part exposed from the encapsulation and an overlapping part,
wherein the first power contact is configured to carry a first current and the second power contact is configured to carry a second current,
wherein a current flow of the first current in the external part of the first power contact points into or out of the semiconductor module and a current flow of the second current in the external part of the second power contact points in the opposite direction of the current flow of the first current in the external part of the first power contact,
wherein the overlapping part of the first power contact and the overlapping part of the second power contact overlap one another such that a current flow of the first current in the overlapping part of the first power contact and a current flow of the second current in the overlapping part of the second power contact point in the same direction,
wherein the overlapping part of each of the first power contact and the second power contact comprises a slot configured to accept a current sensor element, wherein the slot of the first power contact and the slot of the second power contact overlap one another, and wherein the current sensor element is configured to measure a combined current in the overlapping part of the first power contact and the overlapping part of the second power contact.

2. The semiconductor module of claim 1, wherein a first part of the overlapping part of each of the first power contact and the second power contact is fully encapsulated by the encapsulation and a second part of the overlapping part of each of the first power contact and the second power contact is partially encapsulated by the encapsulation.

3. The semiconductor module of claim 1, wherein a minimum distance between the overlapping part of the first power contact and the overlapping part of the second power contact is 1 mm or less.

4. The semiconductor module of claim 1, wherein the overlapping part of the first power contact and/or the overlapping part of the second power contact further comprises one or more narrowings on at least one side of the slot, each respective narrowing being configured to increase a current density in a respective overlapping part between the respective narrowing and the slot.

5. The semiconductor module of claim 1, wherein the overlapping part and the external part of each of the first and second power contacts are at an angle of 60° or more to each other.

6. The semiconductor module of claim 1, further comprising:
a baseplate comprising a metal or metal alloy, the baseplate comprising a through hole arranged directly below the slot of the first power contact and the slot of the second power contact.

7. The semiconductor module of claim 1, wherein the first and second power contacts are leadframe parts with a thickness of 1.0 mm or less.

8. The semiconductor module of claim 1, wherein the first and second currents are 100 A or less.

9. The semiconductor module of claim 1, wherein the semiconductor die and the first and second power contacts are part of an H-bridge circuit.

10. A method for fabricating a semiconductor module, the method comprising:
 providing a semiconductor die;
 encapsulating the semiconductor die with an encapsulation; and
 electrically coupling a first and a second power contact to the semiconductor die,
 wherein the first and second power contacts each comprise an external part exposed from the encapsulation and an overlapping part,
 wherein the first power contact is configured to carry a first current and the second power contact is configured to carry a second current,
 wherein a current flow of the first current in the external part of the first power contact points into or out of the semiconductor module and a current flow of the second current in the external part of the second power contact points in the opposite direction of the current flow of the first current in the external part of the first power contact,
 wherein the overlapping part of the first power contact and the overlapping part of the second power contact overlap one another such that a current flow of the first current in the overlapping part of the first power contact and a current flow of the second current in the overlapping part of the second power contact point in the same direction,
 wherein the overlapping part of each of the first power contact and the second power contact comprises a slot configured to accept a current sensor element, wherein the slot of the first power contact and the slot of the second power contact overlap one another, and wherein the current sensor element is configured to measure a combined current in the overlapping part of the first power contact and the overlapping part of the second power contact.

11. The method of claim 10, wherein encapsulating the semiconductor die comprises providing a plastic frame, the plastic frame comprising an opening for accepting the current sensor element.

12. A system, comprising:
 the semiconductor module of claim 1; and
 a sensor module comprising the current sensor element.

13. The system of claim 12, wherein the current sensor element comprises a first and a second magnetic field sensitive part, wherein the first magnetic field sensitive part is arranged above the overlapping part of the first power contact, and wherein the second magnetic field sensitive part is arranged below the overlapping part of the second power contact.

14. The system of claim 13, wherein a distance between the first and second magnetic field sensitive parts is 2.5 mm or less.

* * * * *